(12) United States Patent
Bae

(10) Patent No.: US 6,534,246 B2
(45) Date of Patent: Mar. 18, 2003

(54) METHOD OF FABRICATING LIQUID CRYSTAL DISPLAY DEVICE HAVING SHORTING BARS

(75) Inventor: Sung-Sik Bae, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 58 days.

(21) Appl. No.: 09/858,904

(22) Filed: May 17, 2001

(65) Prior Publication Data

US 2002/0015918 A1 Feb. 7, 2002

(30) Foreign Application Priority Data

May 18, 2000 (KR) ............................................. 00-26787

(51) Int. Cl.[7] .......................... G02F 1/1333; G03F 7/20
(52) U.S. Cl. .................. 430/318; 430/319; 430/321; 430/396; 438/30
(58) Field of Search ................................ 430/321, 318, 430/319, 396; 438/30

(56) References Cited

U.S. PATENT DOCUMENTS

| 4,231,811 A | 11/1980 | Somekh et al. |
| 5,985,766 A | 11/1999 | Wu et al. |
| 6,043,000 A | * 3/2000 | Park et al. .................. 430/318 |
| 6,043,511 A | 3/2000 | Kim |
| 6,172,733 B1 | * 1/2001 | Hong et al. .................. 349/152 |
| 6,255,130 B1 | * 7/2001 | Kim ............................. 438/30 |

FOREIGN PATENT DOCUMENTS

| JP | 6-250210 | 9/1994 |
| JP | 7-28074 | 1/1995 |
| KR | 1997-28689 | 6/1997 |
| KR | 1999-17658 | 3/1999 |

* cited by examiner

Primary Examiner—John A. McPherson
(74) Attorney, Agent, or Firm—Morgan, Lewis & Bockius LLP

(57) ABSTRACT

A method of fabricating a liquid crystal display device includes forming first and second metal layers on a substrate, forming a first photoresist layer on the second metal layer, partially removing the first photoresist layer, so that the first photoresist layer has first and second portions, removing the first portion of the first photoresist layer and a portion of the second metal layer, so that a portion of the first metal layer is exposed, forming an insulating layer on the second metal layer including the exposed portion of the first metal layer, forming a second photoresist layer on the insulating layer, removing a portion of the second photoresist layer to expose a portion of the insulating layer, and removing the portion of the insulating layer and first metal layer.

29 Claims, 8 Drawing Sheets

US 6,534,246 B2

METHOD OF FABRICATING LIQUID CRYSTAL DISPLAY DEVICE HAVING SHORTING BARS

This application claims the benefit of Korean Application No. 2000-26767 filed May 18, 2000, which is hereby incorporated by reference.

BACKGROUND OF THE INVENTION

1. Field of the Invention

The present invention relates to a liquid crystal display and more particularly, to a method of fabricating liquid crystal display (LCD) device having shorting bars. Although the present invention is suitable for a wide scope of applications, it is particularly suitable for effectively eliminating an electrostatic discharge as well as reducing a fabrication cost in the LCD device.

2. Discussion of the Related Art

As an information technologies rapidly develop, display devices are developed in accordance with the pace of the technology development. The display devices process and display a great deal of information. A cathode ray tube (CRT) has served as a mainstream of the display device area. However, to meet the needs of the current development, a flat panel display device having small size, light weight, and low power consumption is an important subject of research.

A thin film transistor liquid crystal display (TFT LCD) device is an example of the flat panel display devices. The TFT LCD device is very thin and provides superior color display properties. In operation, a thin film transistor serves as a switching element of the TFT LCD device. The thin film transistor of the TFT LCD device switches a pixel such that the pixel controls transmittance of incoming light, which is incident from a back light of the TFT LCD device.

An amorphous silicon layer is widely used for a silicon (active) layer of the thin film transistor. This is because the amorphous silicon layer can be formed on a large, but relatively cheap, glass substrate at a relatively low temperature. The above-mentioned amorphous silicon TFT (a-Si:TFT) is frequently used for thin film transistors.

FIG. 1 is a cross-sectional view illustrating a conventional LCD panel 20. As shown in FIG. 1, the LCD panel 20 has lower and upper substrates 2 and 4 each having a substrate 1 and an interposed liquid crystal layer 10 therebetween.

More specifically, tie lower substrate 2 includes a TFT "S" as a switching element to change an orientation of liquid crystal molecules. A pixel electrode 14 formed thereon for applying a voltage to the liquid crystal layer 10 in accordance with the signals from the TFT "S". The upper substrate 4 has a color filter 8 for implementing color. Further, a common electrode 12 is formed on the color filter 8. The common electrode 12 also serves as an electrode for applying a voltage to the liquid crystal layer 10. The pixel electrode 14 is arranged over a unit pixel portion "P", i.e., a display area.

In addition, to prevent leakage of the liquid crystal layer 10 between the lower and upper substrates 2 and 4, the lower and upper substrates 2 and 4 are sealed with a sealant 6. The lower substrate 2 having the TFT "S" is referred to as an array substrate since a plurality of TFTs are formed in a shape of matrix.

A plurality of functional thin films including an insulating layer, a silicon layer, and a metal layer are repeatedly deposited and etched to fabricate the above-mentioned TFT LCD device. At this point, an electrostatic discharge must be prevented during the fabricating process for the TFT LCD device. If the electrostatic discharge occurs during the fabricating process, the above-mentioned functional thin films consisting of the thin film transistor "TFT" may be damaged.

To prevent the damage due to the above-mentioned electrostatic discharge, shorting bars are adopted for a typical TFT LCD device. The shorting bars are directly connected to each of the gate lines or data lines having a matrix shape such that each line involves an equi-potential with respect to the electrostatic discharge.

Although an amorphous silicon (a-Si:H) layer is widely used for the thin film transistor "S" of FIG. 1, a polysilion layer (poly-Si) is recently adopted for the TFT LCD device. FIG. 2 is a plan view illustrating an array substrate 2 of a conventional TFT LCD device adopting the polysilicon layer. As shown in FIG. 2, a plurality of gate lines 30 are transversely formed whereas a plurality of data lines 40 are formed perpendicular to the gate lines 30. Each gate line 30 crosses a corresponding data line 40.

In addition, across one end portion of the gate lines 30, a gate shorting bar 36 is formed to connect each of the gate lines 30. The data lines 40 are also connected with a data shorting bar (not shown) formed across one end portion of the data lines 30. For convenience, the following explanation is focused on the gate shorting bar 36.

The gate shorting bar 36 is not actually used in driving the TFT LCD device. That is to say, the gate shorting bar 36 is etched away once it has performed functions of protecting the TFT LCD device from electrostatic discharge during the fabricating process for the TFT LCD device. Specifically during the final process for fabricating the array substrate 2, the gate shorting bar 36 is broken at a plurality of line opening portions 38 such that first and second gate lines 30a and 30b and the like are independent of each other. The above-mentioned breaking step for he gate shorting bar 36 is usually performed together with the step of forming the TFT "S" shown in FIG. 1. A detailed explanation about the above-mentioned gate shorting bar 36 will be provided with reference to FIG. 3 as follows:

FIG. 3 is an expanded plan view of the portion "A" shown in FIG 2 and shows a unit pixel region "P" of the array substrate 2. The gate line 30 is transversely formed whereas the data line 40 is formed perpendicular to the gate line 30. At the crossing point between the gate and data lines 30 and 40, a thin film transistor "S" is formed. The thin film transistor "S" has a gate electrode 32, a source electrode 42, a drain electrode 44, and an active layer 50. The gate and source electrodes 32 and 42 are electrically connected with the gate and data lines 30 and 40, respectively.

The drain electrode 44 is spaced apart from the source electrode 42 with a predetermined interval therebetween. In this process, the active layer 50 is made of polysilicon, for example. On the unit pixel region "P" defined by the gate and data lines 30 and 40, a pixel electrode 14 is formed thereon. The thin film transistor "S" serves to control or switch data signals such that the data signals are applied to the pixel electrode 14.

In addition, the gate shorting line 36 is formed parallel to the data line 40, and is connected to the gate line 30 at one end of the gate line 30. As shown in FIG. 2, the gate shorting line 36 is connected to all of the plurality of gate lines 30 such that the electrostatic discharge is prevented during the fabricating process for the array substrate 2.

After all of the functional thin films are formed for the array substrate 2, the gate shorting line 36 is broken at the line opening portion 38 such that the gate line 30 is electrically independent of the other gate lines (shown in FIG. 2). As shown in FIG. 2, the gate shorting line 36 includes the plurality of line opening portions 38 such that all of the date lines 30 are independent of each other. With reference to FIGS. 4A to 4D, a conventional fabricating process for the array substrate 2 will be explained in detail.

FIGS. 4A to 4D are sequential cross-sectional views taken along the line IV–IV of FIG. 3. In FIG. 4A, a buffer layer 60 and an active layer 50 are sequentially formed on the substrate 1 of the array substrate 2 shown in FIG. 3. The active layer 50 is formed of polysilicon (p-Si), which is achieved via a crystallization process. That is to say, an amorphous silicon layer is deposited on the substrate 1, and then is recrystallized via a laser heat treatment, metal induced crystallization (MIC), and solid phase crystallization (SPC).

Alternatively, polysilicon may be directly deposited on the substrate 1 instead of applying the above-mentioned process. For the laser heat treatment, the substrate including the amorphous silicon layer is heated to about 250 ° C., and an eximer laser is irradiated to the amorphous silicon layer such that silicon grains are grown from the amorphous silicon. For the MIC, a metal is deposited on the amorphous silicon layer and is used for crystallization. For the SPC, the amorphous silicon layer is heated at a high temperature for a long time such that the polysilicon is formed.

When the substrate 1 is heated during the recrystallization process, alkali metals, usually Na and K and the like included in the substrate 1 may deteriorate properties of the polysilicon layer 50. To avoid such a problem, the buffer layer 60 is formed between the polysilicon layer 50 and substrate to protect the polysilicon layer 50.

In FIG. 4B, a gate-insulating layer 62 is formed on the buffer layer 60 and the active layer 50. The gate-insulating layer 62 is usually selected from the group consisting of silicon oxide ($SiO_2$) and silicon nitride ($SiN_x$). The gate electrode 32 is then formed on the gate-insulating layer 62. The gate electrode 32 includes first and second metal layers 64a and 64b, which are stacked in this order. The first metal layer 64a is made of aluminum (Al) or aluminum alloy (AlNd) each having a low resistance whereas the second metal is 64b is made of molybdenum (Mo), molybdenum and tungsten alloy (MoW), or titanium (Ti)

When the gate electrode 32 is formed, the gate shorting bar 36 is simultaneously formed to have the same layered shape of the first and second metal layers 64a and 64b. After the gate electrode 32 and the gate shorting bar 36 are formed, a doping ion is doped into uncovered portions of the active layer 50, as shown in FIG. 4B. By the above-mentioned ion doping, a contact resistance between the active layer 50 and the source and drain electrodes (reference numeral 42 and 44 in FIG. 4D) which will be formed in the later step is decreased, and the active layer 50 will obtain proper electrical properties. Specifically, after the ion doping, the active layer 50 is divided into a doped region and an intrinsic region 50c. The doped region includes a source region 50a and a drain region 50b.

For the above-mentioned ion doping, a dopant of Group III or Group V atoms is used. If the Group III atoms are doped into the active layer 50, the active layer 50 becomes n-type semiconductor, whereas if the Group V atoms are doped into, it becomes p-type semiconductor. Phosphorus (P) or boron (B) is usually used as the doping ion.

Next, in FIG. 4C, an interlayer insulating layer 66 is formed on the overall surface of the substrate 1 such that the gate electrode 32 and the active layer 50 are covered. The interlayer insulating layer 66 is formed of the same material as the gate-insulating layer 62. Then, a source contact hole 67a and a drain contact hole 67b are formed through the interlayer insulating layer 66 such that the source and drain regions 50a and 50b are respectively uncovered.

In this process, an etchant is used to form the source and drain contact holes 67a and 67b. When the contact holes 67a and 67b are formed, an opening hole is further formed through the interlayer insulating layer 66 such that a portion of the gate shorting bar 36 is uncovered. Thereafter, the above-mentioned etchant is further used for etching away a portion of the gate shorting bar 36 so as to form the line opening portion 38.

In FIG. 4D, the source and drain electrodes 42 and 44 are formed on the interlayer insulating layer 66. The source and drain electrodes 42 and 44 respectively contact the source and drain regions 50a and 50b via the source and drain contact holes 67a and 67b, respectively. At this time, the data shorting line (not shown) is further formed on the interlayer insulating layer 66.

FIG. 4E illustrates that a passivation layer 68 is formed on the overall surface of the substrate 1 such that the source and drain electrodes 42 and 44 are covered. Through the passivation layer 68, a pixel contact hole 70 is formed such that a portion of the drain electrode 44 is uncovered. Then, the pixel electrode 14 is formed on the passivation layer 68 such that the pixel electrode 14 electrically contacts the drain electrode 44 via the pixel contact hole 70. Portions of the data shorting line are etched away at the time when the pixel contact hole 30 is formed (not shown in FIG. 4E).

As explained in FIGS. 4A to 4E, the gate shorting bar 36 and the data shorting bar (not shown) are formed to directly connect to the gate line 30 and the data line 40, respectively. Thus, the gate and data lines 30 and 40 are protected from an electrostatic discharge. Aster all the functional thin films are formed, the gate and data shorting bars are etched away such that each of the gate and data lines is electrically independent. The etching step or the gate shorting bar 36 will be explained in detail with reference to FIG. 5.

FIG. 5 is an expanded plan view of the portion "Z" shown in FIG. 4C. As previously explained, in forming the source and drain contact holes 67a and 67b of FIG. 4C, an opening hole is further formed through the interlayer insulating layer 66 such that a portion of the gate shorting bar 36 is uncovered. Then, the uncovered portion of the gate shorting bar 36 is subsequently etched away using the same etchant used for forming the above-mentioned opening hole of the interlayer insulating layer 66.

To form the opening hole for the line opening portion 36, a photoresist "PR" is formed on the interlayer insulating layer 66. Then, with the photoresist "PR" used as a mask, the open hole 66a is formed through the interlayer insulating layer 66 such that a portion of the gate shorting bar 36 is uncovered. As explained previously, the etchant is used for forming the opening hole 66a of the interlayer-insulating layer 66. A buffered oxide-etching (BOE) solution or a diluted solution of hydrofluoric acid (HF) is usually used as an etchant. Then, the uncovered portion of the gate shorting bar 36 is further etched away using the same etchant such that the line opening portion 38 is formed. Since the same etchant is used for forming the opening hole 66a and the line opening portion 38, the etching process and its equipment may be simplified.

However, the gate shorting bar 36 includes the first and second metal layers 64a and 64b, which are formed of the log resistive aluminum alloy and the relatively harder molybdenum alloy, respectively. As s result, when the above-mentioned etchant is used for etching the gate shorting bar 36, the aluminum alloy is etched well but the molybdenum alloy is not etched away. Therefore, after the etching is finished, the first metal layer 64a corresponding to the line opening portion 38 is etched away but the second metal layer 64b is left in the shape of a bridge along the line opening portion 38.

The second metal layer 64b remained in the line opening portion 38 causes a problem of the conventional LCD device. The non-etched portion of the second metal layer 64b is finally removed in the later process of ashing the photoresist or cleaning the substrate. However, the removed portion of the second metal layer 64b may contaminate the equipment for fabricating the LCD device and serves as an impurity in a photolithography or etching in the later fabrication.

Additional equipment may be used to prevent the above-mentioned problem. However, the additional equipment causes inclination in the cost and the process number in fabricating an LCD device.

SUMMARY OF THE INVENTION

Accordingly, the present invention is directed to a method of fabricating a liquid crystal display device having a shorting bar that substantially obviates one or more of problems due to limitations and disadvantages of the related art.

An object of the present invention is to provide an effective method for forming a gate shorting bar.

Additional features and advantages of the invention will be set forth in the description which follows and in part will be apparent from the description, or may be learned by practice of the intention. The objectives and other advantages of the invention will be realized and attained by the structure particularly pointed out in the written description and claims hereof as well as the appended drawings. To achieve these and other advantages and in accordance with the purpose of the present invention, as embodied and broadly described, a method of fabricating a liquid crystal display device includes forming first and second metal layers on a substrate, forming a first photoresist layer on the second metal layer, partially removing the first photoresist layer, so that the first photoresist layer has first and second portions, removing the first portion of the first photoresist layer and a portion of the second metal layer, so that a portion of the first metal layer is exposed, forming an insulating layer on the second metal layer including the exposed portion of the first metal layer, forming a second photoresist layer on the insulating layer, removing a portion of the second photoresist layer to expose a portion of the insulating layer, and removing the portion of the insulating layer and first metal layer In another aspect of the present invention, a method or fabricating a liquid crystal display device, includes forming an active layer on the substrate, forming a gate insulating layer on the active layer, forming a gate shorting bar having first and second metal layer on the gate insulting layer, forming a first photoresist on the second metal layer, partially exposing the first photoresist to light using a mask having a diffraction pattern, ashing the first photoresist and a portion of the second metal layer to expose a portion of the first metal layer, forming an interlayer insulating layer on the gate shorting bar, etching the interlayer insulating layer and the exposed portion of the first metal layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

For convenience, a detailed discussion regarding the present invention will be emphasized on the process of breaking a gate-shorting bar of an LCD device.

FIGS. 6A to 6D are cross-sectional views illustrating the above-mentioned process for the LCD device according to the present invention. Since other processes, such as forming a thin film transistor, are similar to those of the related art shown in FIGS. 4A to 4E, any detailed discussions related to such processes are omitted in the present invention.

Figure 6A:
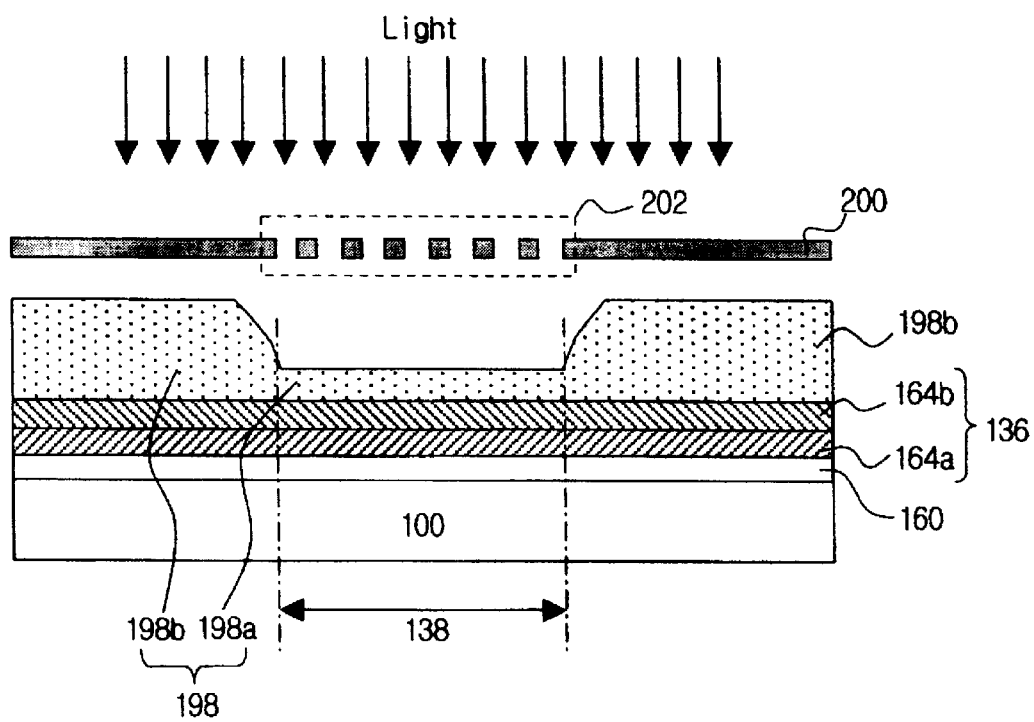
FIGS. 6A to 6D are cross-sectional views illustrating fabrication process of forming a shorting bar according to the present invention.

As shown in FIG. 6A, a gate-insulating layer 160 and a gate shorting bar 136 are sequentially formed on a substrate 100. The gate shorting bar 136 has a first metal layer 164a and a second metal layer 164b. The first metal layer 164a and a second metal layer 164b are included in a gate electrode (not shown). For example, the first metal layer 164a is preferably formed of aluminum (Al) or aluminum alloy (AlNd) each having a low resistance. The second metal layer is 164b is preferably formed of molybdenum (Mo), molybdenum tungsten alloy (MoW), or titanium (Ti).

After the first and second metal layers 164a and 164b of the gate shorting bar 136 are formed on the gate-insulating layer 160, a first photoresist 196 is formed on the second metal layer 164b.

Then, the first photoresist 198 is exposed to light with a mask 200 having a diffraction pattern 202. A first photoresist portion 198a corresponding to the diffraction pattern 202 is partially exposed to light. As a result, the light partially irradiates to the first photoresist portion 198a through the diffraction pattern 202. A second photoresist portion 198b is totally shielded by the other portion of the mask 200. The first photoresist portion 198a has a position corresponding to a line opening portion 138 of the gate shorting bar 136, which will be etched away in the later process.

Thereafter, a developing solution is used for the first photoresist 198 in the subsequent developing process. Thus, about a half of the first photoresist portion 198a is removed. Finally, he first photoresist portion 198a has about a half of the thickness or the second photoresist portion 198b. As previously mentioned, the gate electrode (not shown) is also formed during the same step of forming the first and second metal layers 164a and 164b.

Figure 6B:
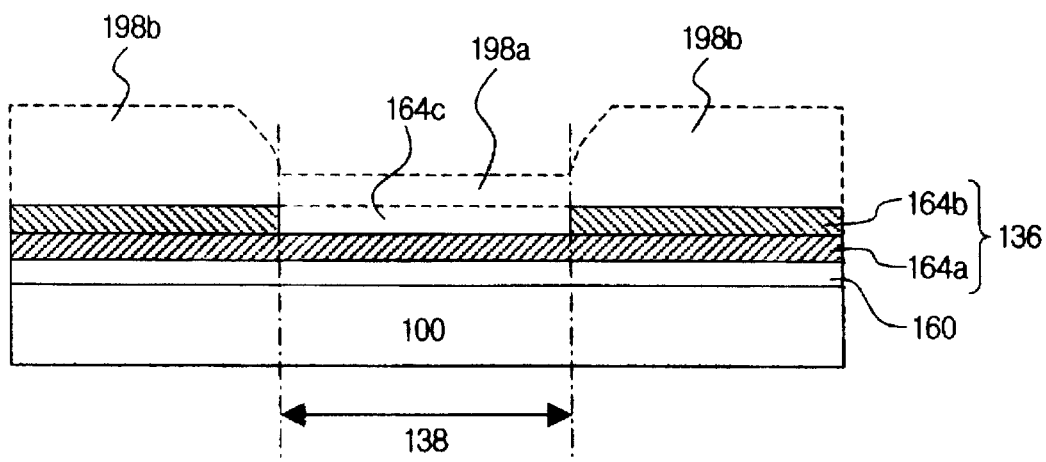

After the above-mentioned photolithography, the first photoresist portion 198a is substantially completely removed as shown in FIG. 6B. A mixture gas of $SF_6(CF_6)$ and $O_2$ is preferably used for ashing the first and second photoresist portions 198 a and 198b. However, the above-mentioned ashing is different in removing the first and second photoresist portions 198a and 198 b. That is to say, during the first photoresist portion 198a is totally removed, only about a half of the second photoresist portion 198b is removed.

Then, when the other half of the second photoresist portion 198b subsequently begins to be removed, the second metal layer 164b below the first photoresist portion 198a, which is already removed, begin, to be removed with the second photoresist portion 198b. Although the second metal layer 164b is completely removed, the first metal layer 164a still remains regardless of the above-mentioned ashing. Therefore, the first metal layer 164a still serves as the gate shorting bar 136 to prevent an electrostatic discharge.

Figure 6C:
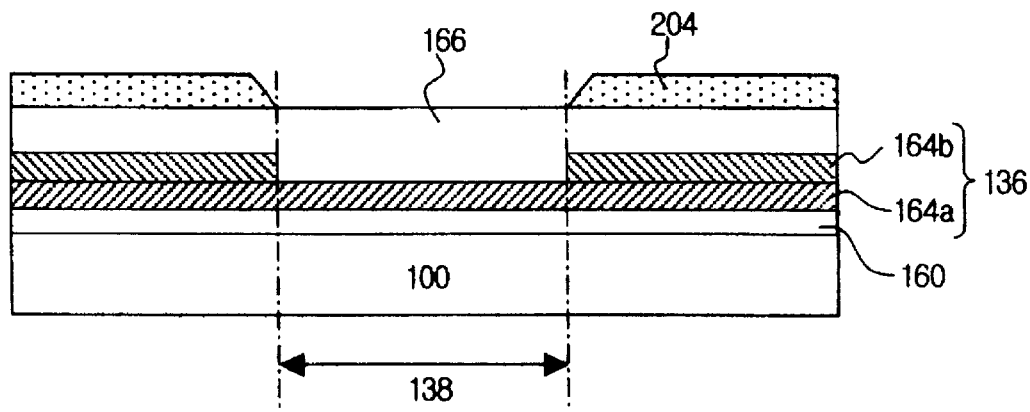
Figure 6D:
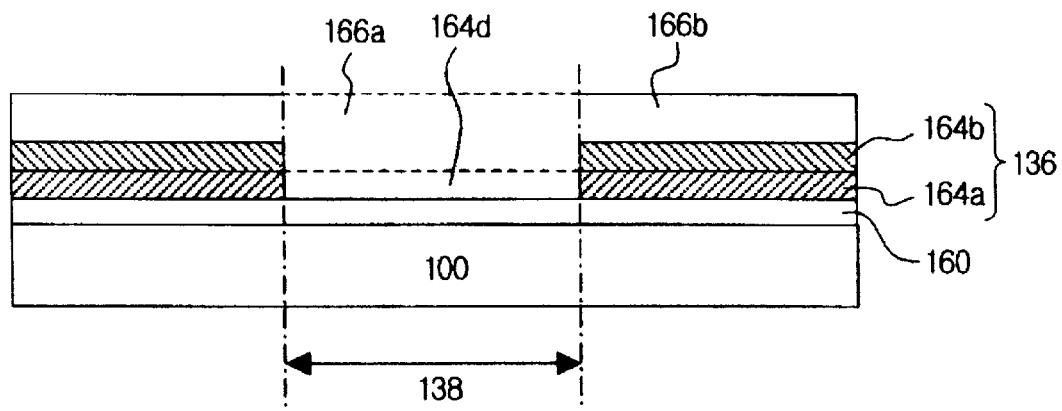

Next, as shown in FIG. 6C, an interlayer insulating layer 166 is formed to cover the gate shorting bar 136. Then, the interlayer insulating layer 166 is patterned such that a source contact hole and a drain contact hole (respectively corresponding to the reference numerals 67a and 67b of FIG. 4C) is formed therein.

To pattern the interlayer insulating layer 166, a second photoresist 204 is formed on the interlayer insulating layer 166. The second photoresist 204 has opening holes corresponding to the source and drain contact holes (not shown) as well as the line opening portion 138 which will be formed in the later process. Since the second photoresist 204 has an opening hole exposing the portion 166a (shown in FIG. 6D) of the interlayer insulating layer 166, the portion 166a of the interlayer insulating layer 166 can be removed in the later step shown in FIG. 6D.

The uncovered portion 166a of the interlayer insulating layer 166 is etched and removed using an etchant such that a portion 164d of the first metal layer 164a is uncovered. The uncovered portion 164d of the first metal layer 164a is also corresponding to the line opening portion 138.

At this point, a buffered oxide-etching (BOE) solution or a diluted hydrofluoric acid (HF) solution is preferably used as hydrofluoric acid (HF) an etchant. After the uncovered portion 166a of the interlayer insulating layer 166 is completely removed, the etching process continues so that the uncovered portion 164d of the first metal layer 164a is further etched away. When the uncovered portion 164d of the first metal layer 164a is substantially completely removed, the etching process is stopped such that the gate shorting bar 136 is broken at the line opening portion 138.

As explained with reference to FIGS. 6A to 6D, not only the second metal layer 164b but also the first metal layer 164a is completely removed by applying the fabricating process of the present invention. Therefore, contaminants due to the remaining portion of the first metal layer 164a are prevented during the later ashing process for removing the second photoresist 204 or cleaning the substrate 100. In addition, since the first metal layer 164a is removed during the same step of etching the interlayer insulating layer 166, additional processes or equipment for removing the first metal layer 164a are not required.

The above-explained present invention is summarized as follows:

At first, the gate electrode (not shown) and the gate shorting bar 136 are formed on the substrate 100. Each of the gate electrode and gate shorting bar 136 includes the first and second metal layers 164a and 164b, which are stacked in this order. Then, the first photoresist 198 is formed on the second metal layer 164b of the gate shorting bar 136, and a portion of the first photoresist 198 is partially exposed to light. The partially exposed portion of the first photoresist 198 corresponds to the line opening portion 136, which will be formed in the later process.

After the above-mentioned exposing, the developing solution is used for the first photoresist 198 in the subsequent developing process so that about a half of the partially exposed portion of the first photoresist 198 is removed. Then, the ashing process for removing the first photoresist 198 is performed using a mixture gas of $SF_6(CF_6)$ and $O_2$. During the ashing process, after the partially exposed portion of the photoresist 198 is completely removed, the second metal layer 164b of the gate shorting bar 136 is further etched away. In other words, when the gate electrode is patterned using a photoresist including the first photoresist 198, the gate shorting bar 136 is also patterned using the first photoresist 198 such that a portion of the second metal layer 164b is also removed.

Figure 1:
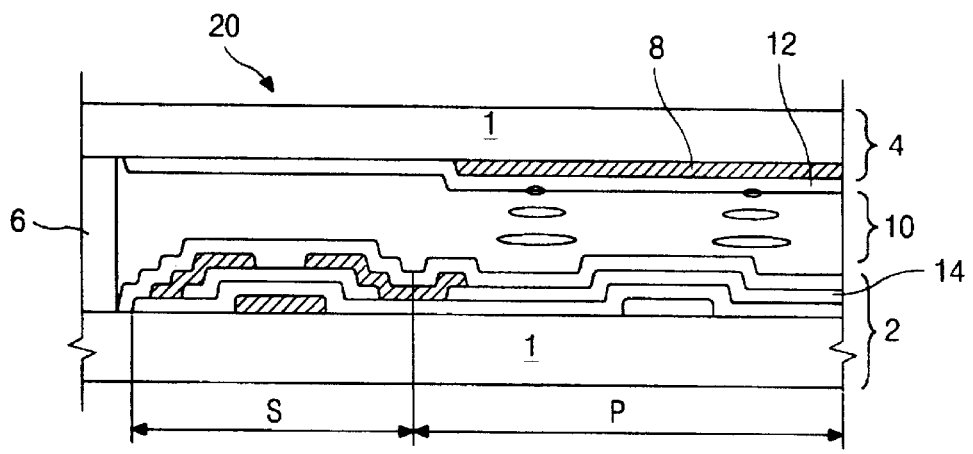
FIG. 1 is a cross-sectional view illustrating a conventional LCD panel.
Figure 2:
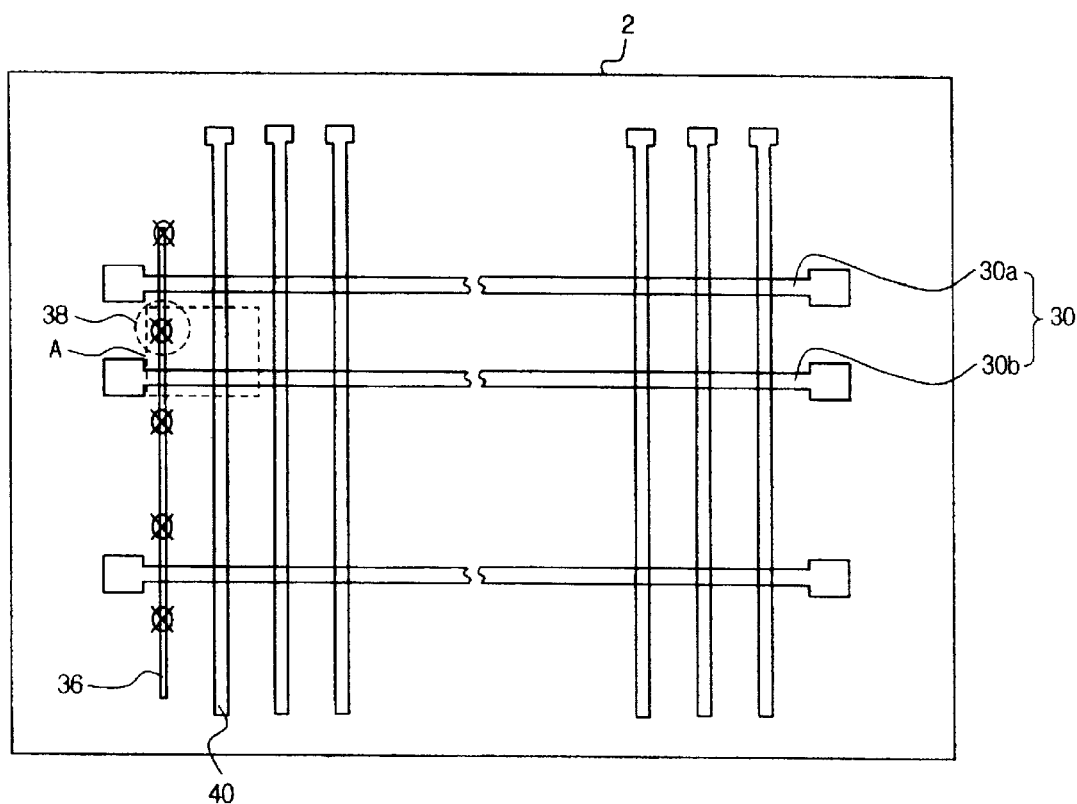
FIG. 2 is a plan view illustrating an array substrate of the conventional TFT LCD device adopting a polysilicon layer.
Figure 3:
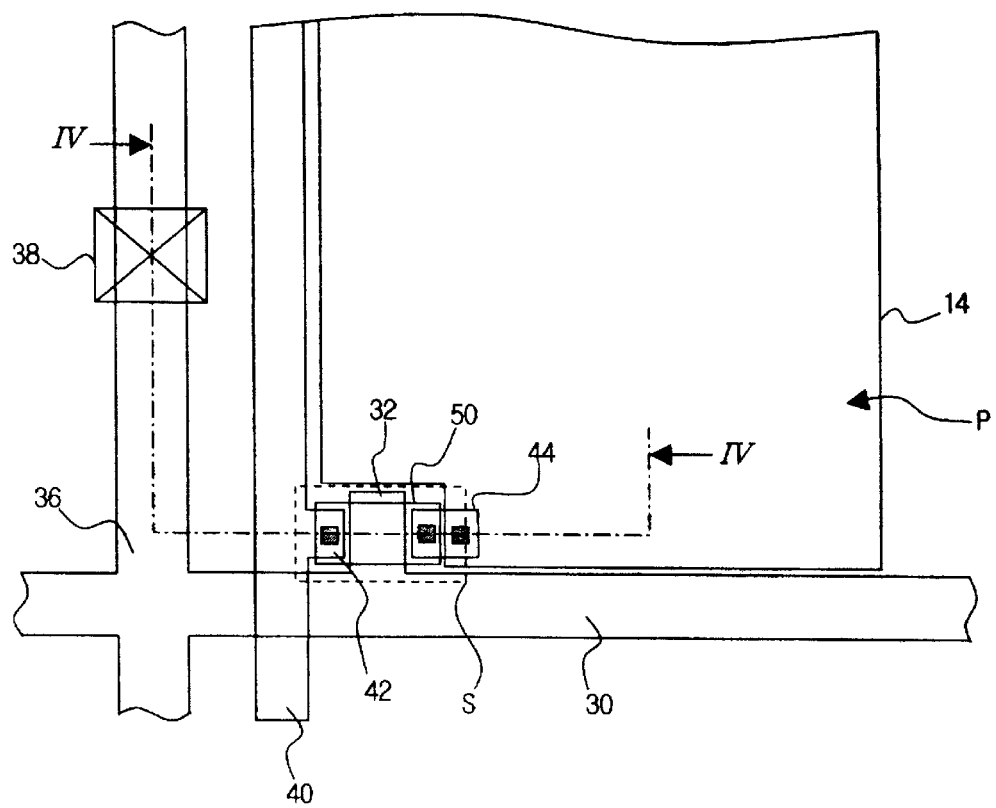
FIG. 3 is an expanded plan view of the portion "A" shown in FIG. 2.
Figure 4A:
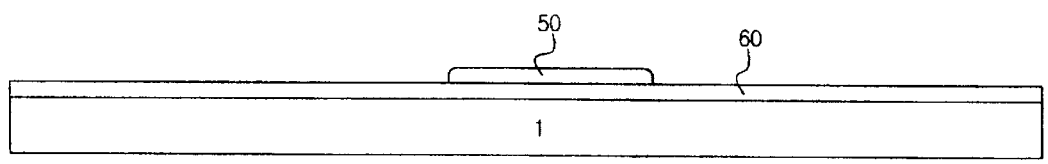
FIGS. 4A to 4D are cross-sectional views illustrating a fabrication process taken along the line IV—IV of FIG. 3.
Figure 4B:
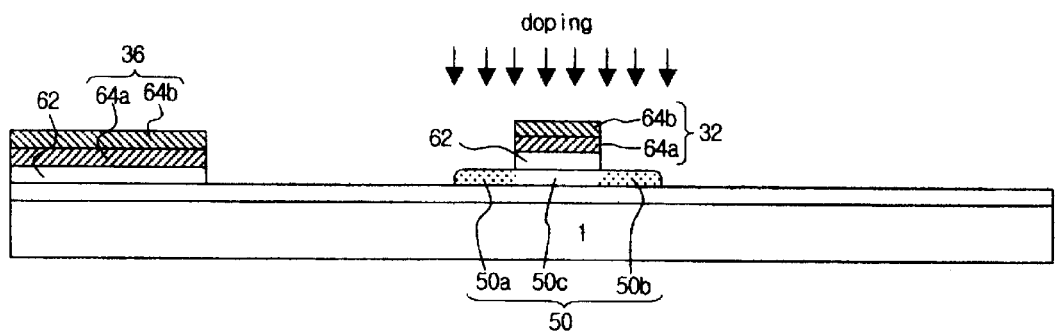
Figure 4C:
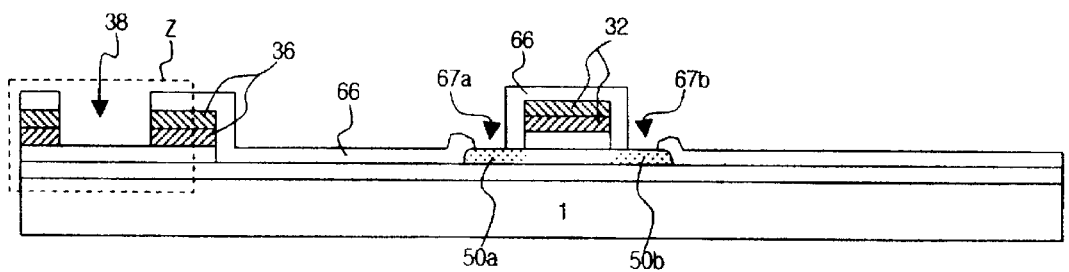
Figure 4D:
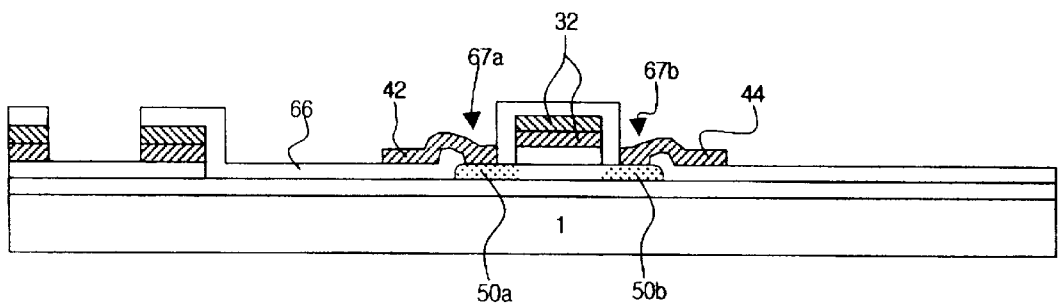
Figure 4E:
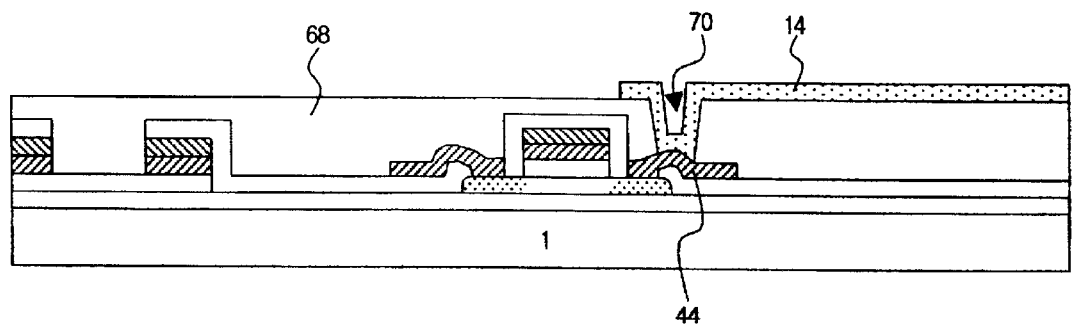
Figure 5:
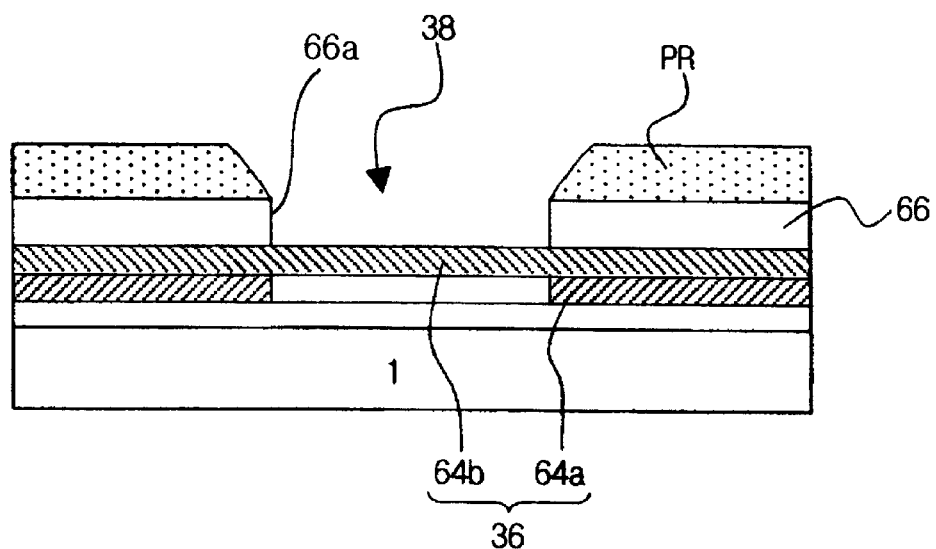
FIG. 5 is an expanded plan view of the portion "Z" shown in FIG. 4C.

According to the related art shown in FIG. 5, a second metal layer 64b remains in the shape of a bridge while the interlayer insulating layer and a first metal layer 64a are etched away using an etchant. The remained second metal layer 64b causes a problem of an LCD device according to the related art. However, in the present invention, the second metal layer 164b is removed together with the first photoresist 198 before the interlayer insulating layer 166 is formed on the gate shorting bar 136.

After the above-explained ashing process, the interlayer insulating layer 166 is deposited and patterned using the second photoresist 204 such that the gate and drain contact holes (not shown) are formed therein. At this point, the interlayer insulating layer 166 is further patterned to have an opening hole uncovering he first metal layer 164a. A buffered oxide-etching (BOE) solution or a diluted hydrofluoric acid (HF) solution is preferably used as an etchant for patterning the interlayer insulating layer 166. After the first metal layer 164a is uncovered during the patterning, the above-mentioned etchant is still used to etch the first metal layer 164a such that the gate shorting bar 136 is broken at the line opening portion 138.

In other words, during the ashing process, the second metal layer 164b of the gale shorting bar 136 is removed together with the first photoresist that is partially exposed to light using the mask 200 having the diffraction pattern 202. Then, the first metal layer 164a is removed during the process of forming the source and drain contact holes.

Figure 7A:
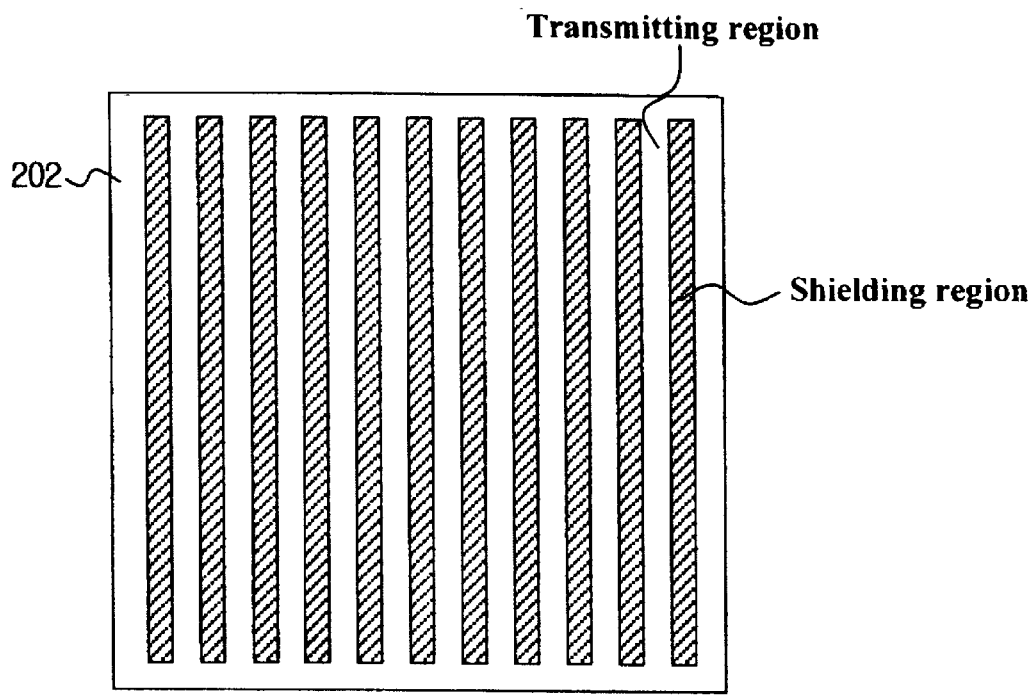
FIGS. 7A to 7C are clan views illustrating various diffraction patterns of the mask shown in FIG. 6A.
Figure 7B:
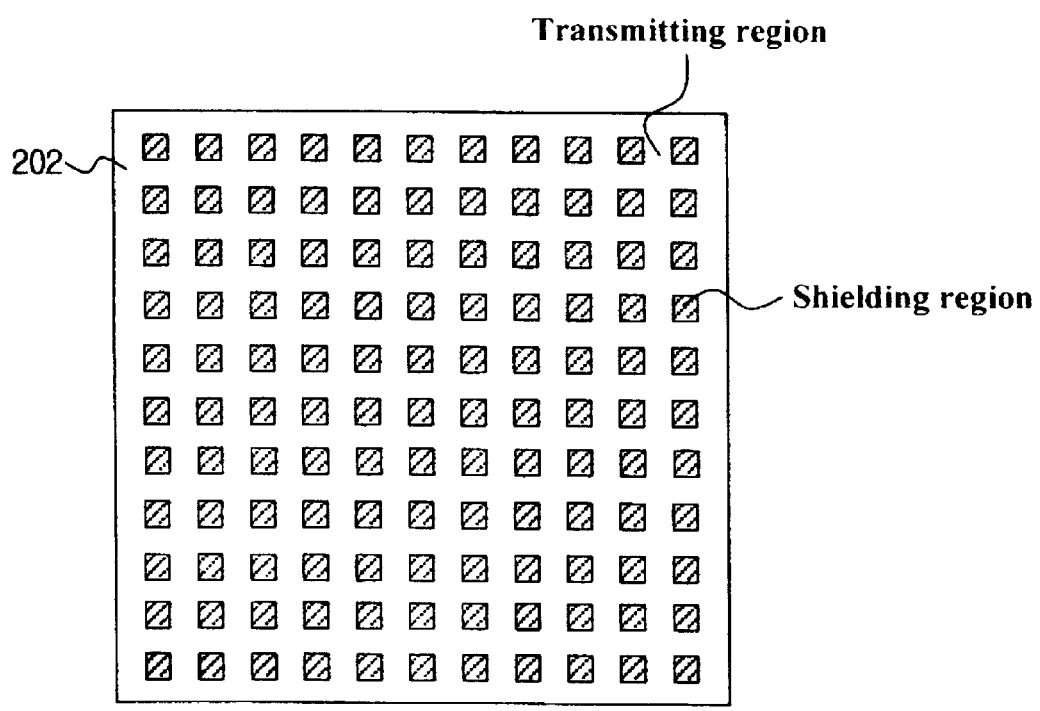
Figure 7C:
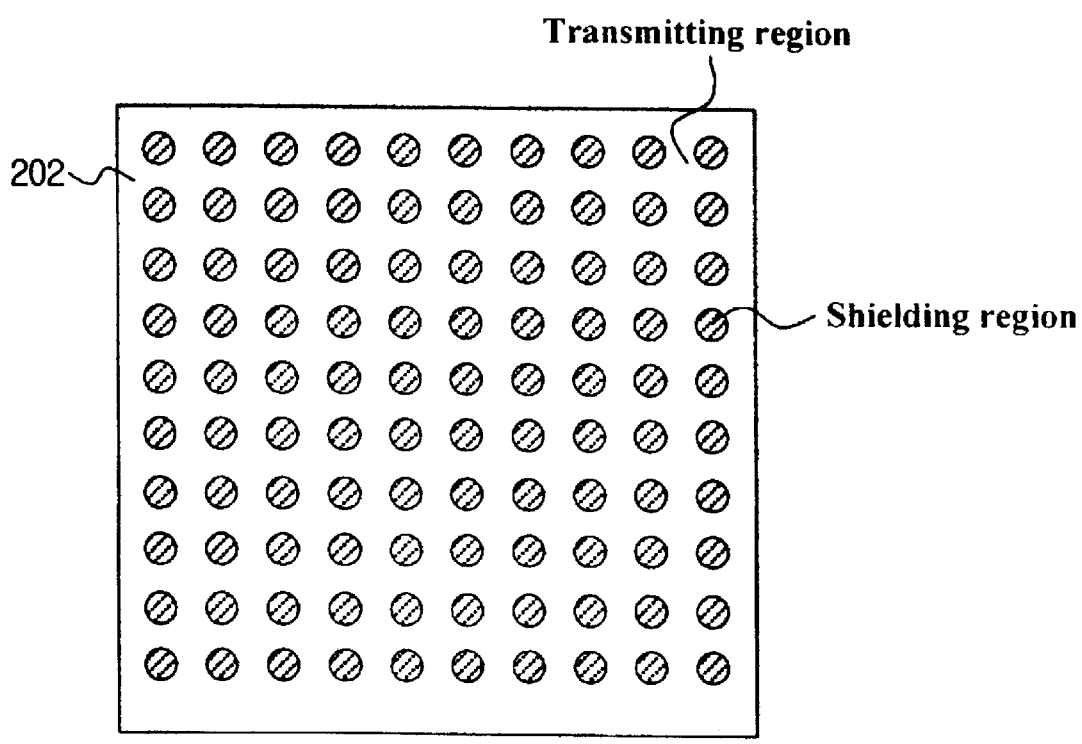

FIGS. 7A to 7C are plan views illustrating various diffraction patterns 202 of the mask 200 shown in FIG. 6A. Each of the diffraction patterns 202 includes a transmitting region and a shielding region. The transmitting and shielding regions diffracts light such that a density of the light is decreased after passing through the diffraction pattern 202. Therefore, when the diffraction pattern 202 is used to expose a photoresist to light, the photoresist is partially exposed. Since the exposed portion of the photoresist is removed by applying a developing solution, about a half of the photoresist is removed after the developing process.

FIG. 7A, each of the transmitting and shielding regions has a striped pattern. FIGS. 7B and 7C shows a rectangular pattern and a circular pattern, respectively, for their shielding regions.

As explained above, by applying the present invention in fabricating an LCD device, the line opening portion of the gate shorting bar is effectively formed without contaminating equipment for the LCD device. In addition, because the second metal layer as well as the first metal layer is completely removed, a fabrication yield is improved.

It will be apparent to those skilled in the art that various modifications and variations can be made in the capacitor and the manufacturing method thereof of the present invention without departing from the spirit or scope of the inventions. Thus, it is intended that the present invention cover the modifications and variations of this invention provided they come within the scope of the appended claims and their equivalents.

What is claimed is:

1. A method of fabricating a liquid crystal display device, the method comprising:
    forming first and second metal layers on a substrate;
    forming a first photoresist layer on the second metal layer;
    partially removing the first photoresist layer, so that the first photoresist layer has first and second portions;
    removing the first portion of the first photoresist layer and a portion of the second metal layer, so that a portion of the first metal layer is exposed;
    forming an insulating layer on the second metal layer including the exposed portion of the first metal layer;
    forming a second photoresist layer on the insulating layer;
    removing a portion of the second photoresist layer to expose a portion of the insulating layer; and
    removing the portion of the insulating layer and first metal layer.

2. The method of claim 1, wherein the first and second metal layers form a shorting bar.

3. The method of claim 2, wherein the first portion has a horizontal width substantially the same as a line opening portion where the shorting bar is disconnected.

4. The method of claim 1, wherein the step of partially removing the first photoresist layer includes the steps of:
    partially exposing the first portion of the first photoresist layer to light; and
    developing the exposed first portion using a developing solution.

5. The method of claim 4, wherein the step of partially exposing the first portion is carried out by using a mask having a diffraction pattern.

6. The method of claim 5, wherein the diffraction pattern has at least one transmitting region and one shielding region.

7. The method of claim 6, wherein the shielding region has one of a stripe, polygonal, and circular shapes.

8. The method of claim 1, wherein the step of removing the first portion of the first photoresist layer and a portion of the second metal layer is executed by an ashing process.

9. The method of claim 8, wherein the ashing process is executed using a mixture gas of $SF_6(CF_6)$ and $O_2$.

10. The method of claim 1, wherein the second portion has a thickness substantially greater than the first portion.

11. The method of claim 1, wherein the first metal layer is selected from the group consisting of aluminum and aluminum alloy.

12. The method of to claim 1, wherein the second metal layer is selected from the group consisting of molybdenum, molybdenum tungsten alloy, and titanium.

13. The method of claim 1, wherein the insulating layer is selected from the group consisting of silicon oxide and silicon nitride.

14. The method of claim 1, wherein the step of removing the portion of the insulating layer and first metal layer is executed by using an etchant.

15. The method of claim 14, wherein the etchant is selected from the group consisting of a buffered oxide-etching solution and a diluted hydrofluoric acid solution.

16. A method of fabricating a liquid crystal display device, the method comprising:
    forming an active layer on the substrate;
    forming a gate insulating layer on the active layer;
    forming a gate shorting bar having first and second metal layer on the gate insulating layer;
    forming a first photoresist on the second metal layer;
    partially exposing the first photoresist to light using a mask having a diffraction pattern;
    ashing the first photoresist and a portion of the second metal layer to expose a portion of the first metal layer;
    forming an interlayer insulating layer on the gate shorting bar;
    etching the interlayer insulating layer and the exposed portion of the first metal layer.

17. The method of claim 16, further comprising the step of implanting ions into the active layer after the step of forming the gate insulating layer.

18. The method of claim 1, wherein the ions include Group III elements.

19. The method of claim 17, wherein the doping ion is phosphorus.

20. The method of claim 17, wherein the ions include Group V elements.

21. The method of claim 17, wherein the ions include boron.

22. The method of claim 16, further comprising:
    forming source and drain electrodes on the interlayer insulating layer;
    forming a passivation layer on the source and drain electrodes; and
    forming a pixel electrode on the passivation layer.

23. The method of claim 22, wherein source and drain contact holes are formed through the interlayer insulating layer in the step of etching the interlayer insulating layer.

24. The method of claim 16, wherein the step of ashing is executed using a mixture gas of $SF_6(CF_6)$ and $O_2$.

25. The method of claim 16, wherein the step of etching includes forming an opening portion of the gate shorting bar.

26. The method of claim 16, further comprising the step of forming a buffer layer on the substrate before the step of forming the active layer.

27. The method of claim 16, wherein the step of etching is executed by using an etchant selected from the group consisting of a buffered oxide-etching solution and a diluted hydrofluoric acid solution.

28. The method of claim 16, wherein the first metal layer is selected from the group consisting of aluminum and aluminum alloy.

29. The method of claim 16, wherein the second metal layer is selected from the group consisting of molybdenum, molybdenum tungsten alloy, and titanium.

* * * * *